United States Patent
Albessard et al.

(10) Patent No.: US 10,032,967 B2
(45) Date of Patent: Jul. 24, 2018

(54) PHOSPHOR AND LIGHT-EMITTING DEVICE

(71) Applicant: Kabushiki Kaisha Toshiba, Minato-ku (JP)

(72) Inventors: Keiko Albessard, Yokohama (JP); Ryosuke Hiramatsu, Yokohama (JP); Kunio Ishida, Tokyo (JP); Yasushi Hattori, Kawasaki (JP); Masahiro Kato, Oiso-machi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 3 days.

(21) Appl. No.: 15/454,107

(22) Filed: Mar. 9, 2017

(65) Prior Publication Data
US 2018/0006194 A1    Jan. 4, 2018

(30) Foreign Application Priority Data
Jun. 29, 2016 (JP) .................................. 2016-129313

(51) Int. Cl.
*H01L 33/50* (2010.01)
*C09K 11/61* (2006.01)

(52) U.S. Cl.
CPC .......... *H01L 33/502* (2013.01); *C09K 11/616* (2013.01)

(58) Field of Classification Search
CPC ............... H01L 33/502; H01L 33/50; H01L 2024/12041; H01L 51/5036; H01L 33/0512; H01L 33/641; C09K 11/617; C09K 11/665; C09K 11/7739; C09K 11/7738; C09K 11/7737; C09K 11/646; C09K 11/675; C09K 11/7705
See application file for complete search history.

(56) References Cited

U.S. PATENT DOCUMENTS

| | | | |
|---|---|---|---|
| 8,252,613 B1* | 8/2012 | Lyons | C09K 11/617 438/45 |
| 8,907,558 B2* | 12/2014 | Hiramatsu | H01L 33/504 313/501 |
| 2012/0256125 A1 | 10/2012 | Kaneyoshi et al. | |
| 2015/0035430 A1 | 2/2015 | Yoshida et al. | |

(Continued)

FOREIGN PATENT DOCUMENTS

| | | |
|---|---|---|
| JP | 2009-528429 | 8/2009 |
| JP | 2012-224536 | 11/2012 |

(Continued)

*Primary Examiner* — Caridad Everhart
(74) *Attorney, Agent, or Firm* — Oblon, McClelland, Maier & Neustadt, L.L.P.

(57) ABSTRACT

A phosphor comprising:
a chemical composition expressed by the following formula $(K_{1-p}, M_p)_a(Si_{1-y}, Mn_y)F_b$ (M is at least one element selected from the group consisting of Na and Ca, and p satisfies $0 \leq p \leq 0.01$, a satisfies $1.5 \leq a \leq 2.5$, b satisfies $5.5 \leq b \leq 6.5$, and y satisfies $0 < y \leq 0.1$),
Wherein the phosphor satisfies I (2,500-3,000)/I (1,200-1,240)<0.04, when I (1,200-1,240) is an intensity of a highest peak in a range of 1,200-1,240 $cm^{-1}$ and I (2,500-3,000) is an intensity of a highest peak in a range of 2,500-3,000 $cm^{-1}$ in an infrared spectrum.

9 Claims, 4 Drawing Sheets

(56) References Cited

U.S. PATENT DOCUMENTS

| | | | |
|---|---|---|---|
| 2015/0315462 A1* | 11/2015 | Murphy | C09K 11/617 257/98 |
| 2015/0329770 A1 | 11/2015 | Kaneyoshi et al. | |
| 2015/0380613 A1* | 12/2015 | Hiramatsu | C09K 11/617 257/98 |
| 2015/0380614 A1* | 12/2015 | Hiramatsu | C09K 11/617 257/98 |
| 2016/0090528 A1* | 3/2016 | Yoshida | C09K 11/617 257/98 |
| 2016/0340577 A1 | 11/2016 | Hiramatsu et al. | |

FOREIGN PATENT DOCUMENTS

| | | |
|---|---|---|
| JP | 2014-141684 | 8/2014 |
| JP | 2015-44973 | 3/2015 |
| JP | 2015-113362 | 6/2015 |
| JP | 2015-224339 | 12/2015 |
| JP | 2016-147961 | 8/2016 |
| WO | WO 2007/100824 A2 | 9/2007 |

\* cited by examiner

PHOSPHOR AND LIGHT-EMITTING DEVICE

CROSS-REFERENCES TO RELATED APPLICATIONS

This application is based upon and claims the benefit of priority from Japanese Patent Application No. 2016-129313, filed Jun. 29, 2016, the entire contents of which are incorporated herein by reference.

FIELD

The embodiments relate to a phosphor and a light-emitting device.

BACKGROUND

A light-emitting device using a light-emitting diode (LED) is constituted by an LED chip and phosphors.

A white LED light-emitting device that emits white light is constituted by an LED chip that emits light in the blue region and phosphors.

For example, a pseudo-white LED light-emitting device includes a combination of an LED chip that emits blue light and a mixture of phosphors.

For example, a three-wavelength type white LED using an LED chip that emits blue light, and a green light-emitting phosphor, a yellow light-emitting phosphor and a red light-emitting phosphor has been developed.

As one of the red light-emitting phosphors used in light-emitting devices, a $K_2SiF_6$:Mn phosphor is known. In order to improve the light-emitting efficiency and the reliability of the light-emitting device, it is necessary to improve the quantum efficiency of the $K_2SiF_6$:Mn phosphor.

DETAILED DESCRIPTION

Figure 1:
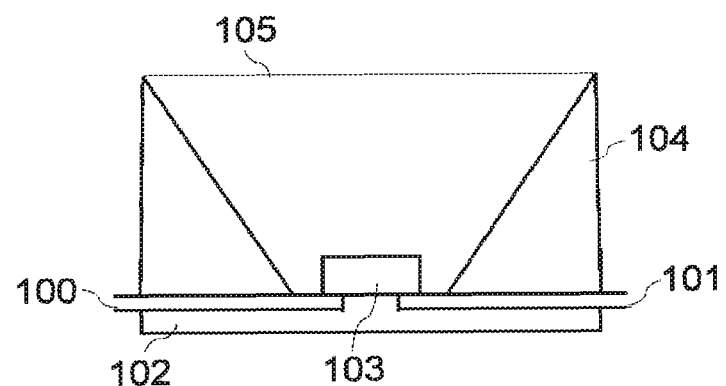
FIG. 1 shows a cross-sectional drawing of a light-emitting device.

The embodiments will be explained with referring to the following drawings.

The elements having the same symbol represent the same elements. The drawings are schematic and conceptual, and thus the relationship between the thickness and width of each unit, the ratio coefficient between the sizes of the units, and the like are not necessarily the same as the actual ones. Furthermore, in some cases, even in the cases when the same unit is represented, the sizes and ratio coefficients are represented differently from one another among the drawings.

(First Embodiment)

The present inventors did intensive studies and researches on a phosphor constituted by mainly potassium fluorosilicate and activated with manganese (Mn), and found that there is a correlation between the intensity ratio of specific peaks in an infrared spectrum and the light-emitting efficiency of the phosphor.

A phosphor in the embodiment will be explained below. The phosphor in the embodiment is a red light-emitting phosphor. The phosphor of the embodiment includes at least one kind of element from the group consisting of potassium (K), sodium (Na) and calcium (Ca), and includes silicon (Si) and fluorine (F).

The basic crystal structure of the phosphor in the embodiment is potassium fluorosilicate. The phosphor in the embodiment is activated with manganese (Mn). This phosphor generally absorbs light in the regions from ultraviolet to blue, and emits red light.

In the phosphor, since the crystal structure is constituted by potassium fluorosilicate and a part of the elements constituting the crystal is substituted with other elements such as manganese (Mn), the phosphor can emit light. It is also possible to substitute with other elements.

The basic composition of the phosphor in the embodiment is expressed by Formula (1).

$$(K_{1-p}, M_p)_a(Si_{1-y}, Mn_y)F_b \qquad (1)$$

M is at least one kind of element selected from the group consisting of Na and Ca. p is an atomic ratio that satisfies 0 or more and 0.01 or less. a is an atomic ratio that satisfies 1.5 or more and 2.5 or less. b is an atomic ratio that satisfies 5.5 or more and 6.5 or less. y is an atomic ratio that satisfies more than 0 and 0.1 or less.

In order to use the phosphor in the embodiment as a red light-emitting phosphor, the phosphor includes manganese (Mn) as an activator. The valency of the manganese (Mn) is preferably +4. Manganeses having other valency may also be contained in the phosphor, but it is preferable that the ratio thereof is small. It is even more preferable that the whole manganese (Mn) contained in the phosphor has a valency of +4.

M is at least one kind of element selected from the group consisting of Na and Ca. Na and Ca are contained in a raw material, and thus are unavoidable. Since it is desirable that the amounts of Na and Ca are small, it is preferable that p is 0 or more and 0.01 or less. It is further preferable that p is 0 or more and 0.001 or less.

In the case when the phosphor does not contain manganese (Mn), that is, y=0 in Formula (1), even if the phosphor is allowed to absorb light in the regions from ultraviolet to blue, the light emission from the phosphor cannot be confirmed. Therefore, it is necessary that y in Formula (1) is more than 0. When the content of manganese (Mn) in the phosphor is gradually increased, the light-emitting efficiency of the phosphor tends to be improved, and thus y in Formula (1) is preferably 0.01 or more.

When the content of manganese (Mn) in the phosphor is too much, a concentration quenching phenomenon occurs, and thus the light-emitting intensity of the phosphor tends to be weakened. Therefore, the atomic ratio y of manganese contained in the phosphor is preferably more than 0 and 0.1 or less. The atomic ratio is further preferably more than 0 and 0.06 or less.

The phosphor of the embodiment may contain elements other than potassium (K), sodium (Na), calcium (Ca), silicon (Si), fluorine (F) and manganese (Mn). The phosphor may contain, for example, titanium (Ti), strontium (Sr), cesium (Cs), germanium (Ge) and the like in small amounts. Even in the case when these elements are contained in the phosphor in small amounts, the phosphor shows a similar light emission spectrum in the red region. However, in view of the stability of the phosphor, the costs for the synthesis of the phosphor, and the like, it is preferable that the contents of these elements are small. Even in the case when elements other than those mentioned above are contained as unavoidable components, the effect of the phosphor in the embodiment is sufficiently exerted.

The phosphor in the embodiment does not contain oxygen from the stoichiometric viewpoint. However, in some cases, oxygen is unavoidably incorporated in the phosphor during the process for synthesizing the phosphor, or the decomposition of the phosphor surface after the synthesis, or the like. The content of oxygen in the phosphor is desirably zero, but when a ratio of (oxygen content)/[(fluorine content)+(oxygen content)] is less than 0.05, the light-emitting efficiency of the phosphor is not significantly deteriorated.

The phosphor in the embodiment is excited by a light source that emits light in the regions from ultraviolet to blue. It is desirable to use a light source that emits light in a wavelength region of 430 nm or more and 470 nm or less in view of the excited spectrum of the phosphor. A light source that emits light at a wavelength out of the above-mentioned wavelength range is not preferable in view of the light emitting efficiency of the phosphor. Examples of the light-emitting element used for the light source include solid light source elements such as LED chips and laser diodes.

The white light-emitting device is constituted by a combination including an excitation light source, and at least one from a red light-emitting phosphor and a green light-emitting phosphor and a yellow light-emitting phosphor. Furthermore, in the case when ultraviolet ray is used for the excitation light source, a white light-emitting device can be obtained by using the phosphor in the embodiment, a blue phosphor, a green phosphor and a yellow phosphor in combination. The kind of phosphors used for the white light-emitting device are arbitrarily selected according to the purpose of the white light-emitting device. For example, in a white light-emitting device for use in a lighting device having a low color temperature, the phosphor in the embodiment and a yellow light-emitting phosphor are combined. By suitably combining the excitation light source and the phosphors, a white light-emitting device that attains high efficiency and high color rendering property can be provided.

Blue light-emitting phosphors have a light-emission peak at the wavelength region of 440 nm or more and 500 nm or less. For examples, blue light-emitting phosphors include halophosphate phosphors such as $(Sr, Ca, Ba, Mg)_5(PO_4)_3(Cl, Br):Eu$ and $(Sr, Ca, Ba, Mg)_5(PO_4)_3Cl:Eu$, phosphate phosphors such as $2SrO.0.84P_2O_5.0.16B_2O_3:Eu$, and alkaline earth metal aluminate phosphors such as $BaMgAl_{10}O_{17}:Eu$, and the like. Green light-emitting phosphors and yellow light-emitting phosphors are phosphors that emit light in the wavelength region of 520 nm or more and 570 nm or less. Examples of such phosphors include silicate phosphors such as $(Sr, Ca, Ba)_2SiO_4:Eu$ and $Ca_3(Sc, Mg)_2Si_3O_{12}:Ce$, oxide phosphors such as $(Y, Gd)_3(Al, Ga)_5O_{12}:Ce$, sulfide phosphors such as $(Ca, Sr, Ba)Ga_2S_4:Eu$, alkaline earth acid nitride phosphors such as $(Ca, Sr, Ba)Si_2O_2N_2:Eu$ and $(Ca, Sr)$-αSiAlON or βSiAlON activated with Eu, and the like. These phosphors have a light-emission peak in the wavelength region of 520 nm or more and 570 nm or less. The light-emission peak refers to the wavelength where the intensity of the emission spectrum is the highest. The light-emission peaks of the exemplified phosphors have been reported in documents and the like until now. Meanwhile, in some cases, a change in the light-emission peak of about 10 nm is observed in the wavelength region due to addition of elements in small amounts or slight variation in the composition during the preparation of the phosphors, and it is considered that such phosphors are also encompassed in the exemplified phosphors.

For the white light-emitting device using the phosphor in the embodiment, an orange light-emitting phosphor and a red light-emitting phosphor can also be used according to its purpose.

For examples, orange light-emitting phosphors and red light-emitting phosphors include silicate phosphors such as $(Sr, Ca, Ba)_2SiO_4:Eu$, tungstate phosphors such as $Li(Eu, Sm)W_2O_8$, acid sulfide phosphors such as $(La, Gd, Y)_2O_2S:Eu$, sulfide phosphors such as $(Ca, Sr, Ba)S:Eu$, nitride phosphors such as $(Sr, Ba, Ca)_2Si_5N_8:Eu$ and $(Sr, Ca)AlSiN_3:Eu$, and the like. By combining these phosphors with the phosphor in the embodiment, not only the efficiency but also the color rending property in lighting use and the color region in backlight use can further be improved. However, when the number of phosphors used in the white light-emitting device is too large, a re-absorption/light-emitting phenomenon in which the phosphors absorb and emit light one another, and scattering phenomenon occurs, and thus the light-emitting efficiency of the white light-emitting device decreases.

The phosphor of the embodiment will further be explained below in detail. Conventionally, further improvement of light-emitting efficiency has been required for phosphors having a basic structure including potassium, silicon and fluorine and activated with manganese. Various methods for solving the problem have been considered, but there has been a room to improve in either method. The present inventors have found that, among such phosphors, the phosphor that shows a specific infrared spectrum shows excellent properties.

Specifically, in an infrared spectrum, in the case when a peak intensity of a peak having a maximum intensity among peaks present in the range of 1,200-1,240 $cm^{-1}$ is set as I (1,200-1,240) and a peak intensity of a peak having a maximum intensity among peaks band present in the range of 2,500-3,000 $cm^{-1}$ is set as I (2,500-3,000), the phosphor shows excellent properties when the value of I (2,500-3,000)/I (1,200-1,240) is lower than 0.04. The intensity used herein is the absorbance of the infrared spectrum. In addition, the peak is also referred to as an absorption peak.

It is considered that such intensity ratio in the infrared spectrum corresponds to the various contents of hydrogen bonded water molecules present in the phosphor. That is, as mentioned below, it is assumed that the absorption spectrum present in the range of 2,500-3,000 $cm^{-1}$ is derived from the hydrogen bonded water molecules in the phosphor, and it is considered that the value of I (2,500-3,000)/I (1,200-1,240) corresponds to the amount of the hydrogen bonded water molecules.

An example of a method for preparing the phosphor in the embodiment will be shown below. The phosphor in the embodiment is prepared by adding a potassium-containing raw material to an aqueous hydrofluoric acid solution in which a mixture of hexafluorosilicic acid ($H_2SiF_6$) and potassium hexafluoromanganate ($K_2MnF_6$) is dissolved, and progressing a reaction by a method such as co-deposition (coprecipitation). The product obtained in the aqueous hydrofluoric acid solution is filtered under suction, and washed. In the filtration process, several filters having different opening sizes may be used. The product is dried after the filtration process to give the phosphor of the embodiment.

In order to decrease the value of I (2,500-3,000)/I (1,200-1,240) as mentioned above, it is required to decrease the hydrogen bonded water molecules contained in the phosphor. For example, since the specific surface area of the phosphor becomes larger as particle size of phosphor becomes smaller, the hydrogen bonded water molecules adhere more easily to the surface of the phosphor particles. Therefore, by using a filter having a large opening size in the filtration process, small size phosphor particles can be removed, and thus the hydrogen bonded water molecules can be decreased.

The phosphor is classified depending on the method for applying the phosphor onto the light-emitting device. For example, in a general white LED using excitation light having a light-emission peak in the blue region, it is generally preferable to use a particulate phosphor classified into 1 to 50 µm. When the particle size of the classified phosphor is too small, the light-emitting intensity may decrease. When the particle size of the classified phosphor is extremely large, the apparatus for applying the phosphor layer is clogged with the phosphor, and thus decrease in operation efficiency and yield and color unevenness in a light-emitting device may occur. Next, the measurement of the infrared spectrum of the phosphor of the embodiment will be explained.

For the measurement of the infrared spectrum of the phosphor described in the embodiments of the present specification, an infrared spectrometer such as a VERTEX70V FT-IR spectrometer ((trade name) manufactured by Bruker Optics) was used. The conditions for the measurements were, for example, a wave number resolution of 4 cm$^{-1}$, a number of sample scanning of 100 times, and a range of measured wave numbers of 400 to 4,000 cm$^{-1}$.

As the method for measuring the infrared spectrum, a transmission method, a reflection method, a total reflection measurement method (ATR method), a diffusion reflection method, and the like are present. Since a phosphor is generally a powder having a particle size of several micrometers to several ten micrometers, it is preferable to measure the infrared spectrum by a diffusion reflection method in which the sample is easily adjusted. Furthermore, in general, in the diffusion reflection method, the sample is mixed with KBr or KCl powder to a suitable concentration (about 1 to 10%), and then measured. However, since the intensity of the infrared spectrum of the phosphor of the embodiment is low in the range of 2,500-3,000 cm$^{-1}$, the infrared spectrum can be measured without using KBr or KCl powder.

The method for measuring the infrared spectrum and the measurement of the infrared spectrum are not limited to those mentioned above.

When I (1,200-1,240) and I (2,500-3,000) of the measured infrared spectrum are specified, the positions (wave numbers) of the peaks in the infrared spectrum of the phosphor sometimes change depending on the composition of the phosphor and the condition of the synthesis. Therefore, in this embodiment, the position of the peak near 1220 cm$^{-1}$ is important, but the position of this peak sometimes varies generally within 1,200-1,240 cm$^{-1}$, or about 1210-1230 cm$^{-1}$ even under preferable conditions.

In order to measure a wide wave number region, it is preferable to use a TGS (DTGS) detector, which has high response linearity.

The intensity of the infrared spectrum of the phosphor may be changed by a surface treatment after the synthesis of the phosphor, or the like. Therefore, it is preferable to evaluate the phosphor before subjecting the phosphor to a surface treatment or the like after the synthesis.

In the present embodiment, the relationship between the peak intensity ratio of specific peaks of the infrared spectrum and the luminescence property of the phosphor has not been sufficiently clarified. However, it is assumed that the lowering of the light-emitting efficiency occurs since the base composition of the phosphor contains hydrogen bonded water molecules, and thus the valency of Mn in the phosphor changes and accompanies coloring.

Next, the powder X-ray diffraction (hereinafter sometimes referred to as XRD) measurement of the phosphor of the embodiment will be explained. By the XRD measurement, it can be confirmed that the phosphor has a $K_2SiF_6$ crystal structure (JCPDS Card No. 01-075-0694).

The XRD measurement of the phosphor can be carried out by a SmartLab ((trade name) manufactured by Rigaku Corporation) or the like. The measurement conditions may vary according to the kind of the phosphor to be measured, the particle shape, and the like, and may be, for example, as follows. X-ray source: CuKα, measurement voltage and current: 45 kV and 200 mA, step width: 0.01°, measurement speed: 20°/min.

From the result of the XRD measurement, the obtained diffraction pattern is compared with the powder X-ray diffraction intensity database. The diffraction peaks of $K_2SiF_6$ (JCPDS Card No. 01-075-0694) having strong intensities around 2θ=18.88°, 31.07°, 38.30° and 44.52° are respectively attributed to the plane directions of (111), (220), (222) and (400). If the respective diffraction peaks can be confirmed, it can be confirmed that the phosphor of the embodiment has a $K_2SiF_6$ crystal structure. However, the above-mentioned numerical values may shift by adding a small amount of other element or changing the conditions of the synthesis.

Next, the measurement of the external quantum efficiency of the phosphor of the embodiment will be explained. The absorption α and the internal quantum efficiency η' of the phosphor are measured by, for example, a C9920-02G type Absolute PL quantum yield spectrometer ((trade name) manufactured by Hamamatsu Photonics K.K.). During the measurement of the absorption α and the internal quantum efficiency η' of the phosphor, the excitation light is a blue light having a peak wavelength in the range of 430 to 470 nm and a half width of 5 to 15 nm.

The absorption α and the internal quantum efficiency η' are respectively represented by Formulas (2) and (3). E (λ) is the whole spectrum (in terms of photon number) of the light emitted by the excitation light source with which the phosphor is irradiated, R (λ) is the spectrum (in terms of photon number) of the light emitted by the excitation light source and reflected by the phosphor, and P (λ) is the spectrum (in terms of photon number) of the light emitted by the phosphor.

$$\text{Absorption } (\alpha) = \frac{\int \lambda \cdot [E(\lambda) - R(\lambda)] d\lambda}{\int \lambda \cdot [E(\lambda)] d\lambda} \quad (2)$$

$$\text{Internal quantum efficiency } (\eta') = \frac{\int \lambda \cdot [P(\lambda)] d\lambda}{\int \lambda \cdot [E(\lambda) - R(\lambda)] d\lambda} \quad (3)$$

The external quantum efficiency η herein is the value calculated by multiplying the absorption α and the internal quantum efficiency η'. The external quantum efficiency η is represented by Formula (4).

$$\text{External quantum efficiency } (\eta) = \frac{\int \lambda \cdot [P(\lambda)] d\lambda}{\int \lambda \cdot [E(\lambda)] d\lambda} \quad (4)$$

The internal quantum efficiency $\eta'$ of the phosphor of the embodiment was measured to be 95% or more. In the case when the internal quantum efficiency $\eta'$ is less than 95%, not only the brightness of a light-emitting device using the phosphor decreases, but also problems of decrease in reliability and the like are caused since the phosphor contains much hydrogen bonded water molecules. Specifically, the internal quantum efficiency $\eta'$ most closely relates to the brightness of the light-emitting device, and thus the internal quantum efficiency $\eta'$ is preferably 95% or more.

(Second Embodiment)

FIG. 1 illustrates a cross-sectional drawing of a light-emitting device according to the embodiment.

The illustrated light-emitting device has a lead 100, a lead 101, a stem 102, a semiconductor light-emitting element 103, a reflection surface 104 and a phosphor layer 105. The semiconductor light-emitting element 103 is mounted by an Ag paste or the like on the center part of the bottom surface. As the semiconductor light-emitting element 103, a semiconductor light-emitting element that emits ultraviolet ray, or a semiconductor light-emitting element that emits light of the visible region can be used. For example, semiconductor light-emitting diodes such as GaAs-based and GaN-based semiconductor light-emitting diodes, and the like can be used. The dispositions of the lead 100 and the lead 101 can be suitably changed.

The phosphor layer 105 is disposed in a concave portion of the light-emitting device. This phosphor layer 105 can be formed by, for example, dispersing the phosphor of the embodiment at a ratio of 5 wt % or more and 50 wt % or less in a resin layer 211 containing a silicone resin.

As the semiconductor light-emitting element 103, it is also possible to use a semiconductor light-emitting element of a flip chip-type having an n-type electrode and a p-type electrode on an identical plane. In this case, problems due to a breaking and peeling of the wire and light absorption by the wire are solved, whereby a semiconductor light-emitting device having high reliability and a high luminance can be obtained. Furthermore, the following constitution can be provided. Specifically, an n-type electrode is formed on the rear surface of an n-type substrate, a p-type electrode is formed on the upper surface of a semiconductor layer on the substrate, and the n-type electrode or the p-type electrode is mounted on the lead. The p-type electrode or the n-type electrode can be connected to the other lead by the wire. The size of the semiconductor light-emitting element 103, and the size and shape of the concave portion can be suitably changed.

Figure 2:
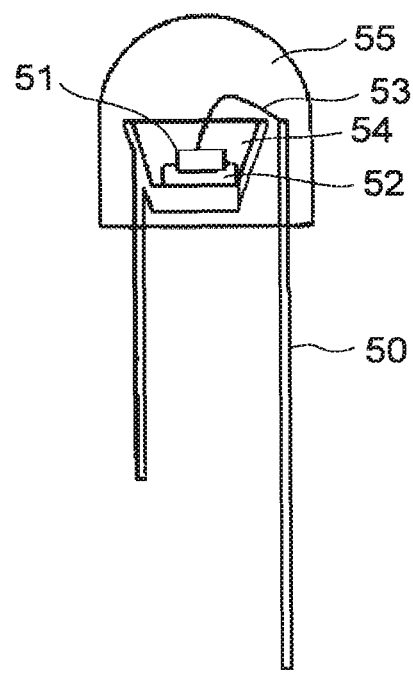
FIG. 2 shows the cross-sectional drawing of the light-emitting device.

FIG. 2 shows an example of a bullet-shaped (shell-shaped) light-emitting device. The semiconductor light-emitting element 51 is mounted on a lead 50' through a mount material 52, and covered with a predip material 54. By a wire 53, a lead 50 is connected to a semiconductor light-emitting element 51, and enclosed with a casting material 55. The predip material 54 contains the phosphor of the embodiment.

As mentioned above, the light-emitting device of the embodiment such as a white LED is optimal as not only a general illumination and the like but also a light-emitting device that is used in combination with color filters and the like, such as a light source for a backlight for a liquid crystal, for example. Specifically, the light-emitting device of the embodiment can be used as a red light-emitting material for a backlight light source of a liquid crystal or an inorganic electroluminescence device using a blue light-emitting layer.

The embodiment will further be explained below in detail with showing Examples and Comparative Examples, but the present embodiment is not limited to the following Examples as long as it does not go beyond the purport of the embodiment.

The phosphor will be mentioned below in each example.

EXAMPLE 1

4.5 g of a $KMnO_4$ powder and 72 g of a KF powder were dissolved in 300 ml of an aqueous HF solution having a concentration of 49%, an aqueous $H_2O_2$ solution having a concentration of 35% was gradually added dropwise, and a reaction was sufficiently conducted in an aqueous HF solution to synthesize $K_2MnF_6$. The synthesized $K_2MnF_6$ was filtered by suction to give a $K_2MnF_6$ powder. Furthermore, 4.3 g of an $SiO_2$ powder was dissolved in 200 ml of an aqueous HF solution having a concentration of 49% to adjust an $H_2SiF_6$ solution. Furthermore, 12 g of a KF powder was dissolved in 40 ml of an aqueous HF solution having a concentration of 49% to adjust an aqueous KF solution. 0.165 g of the synthesized $K_2MnF_6$ powder was dissolved in 200 ml of the adjusted $H_2SiF_6$ solution to adjust a reaction solution. 45 ml of the aqueous KF solution, which had been adjusted in advance, was added dropwise to the adjusted reaction solution and sufficiently reacted in the reaction solution to synthesize $K_2SiF_6$:Mn. The synthesized $K_2SiF_6$:Mn was filtered by a suction filtration method using a filter having an opening size of 10 μm diameter to give the $K_2SiF_6$:Mn phosphor powder. The amount of Na and Ca is $0 \leq p \leq 0.01$.

Figure 3:
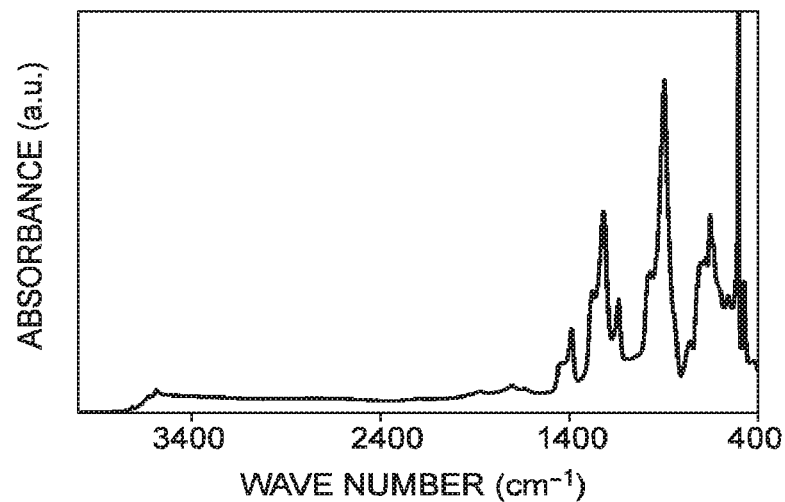
FIG. 3 shows an infrared spectrum of the phosphor.

FIG. 3 shows an example of the infrared spectrum of the phosphor. The horizontal axis shows the wave number ($cm^{-1}$), and the vertical axis shows the absorbance (a.u.).

Figure 4:
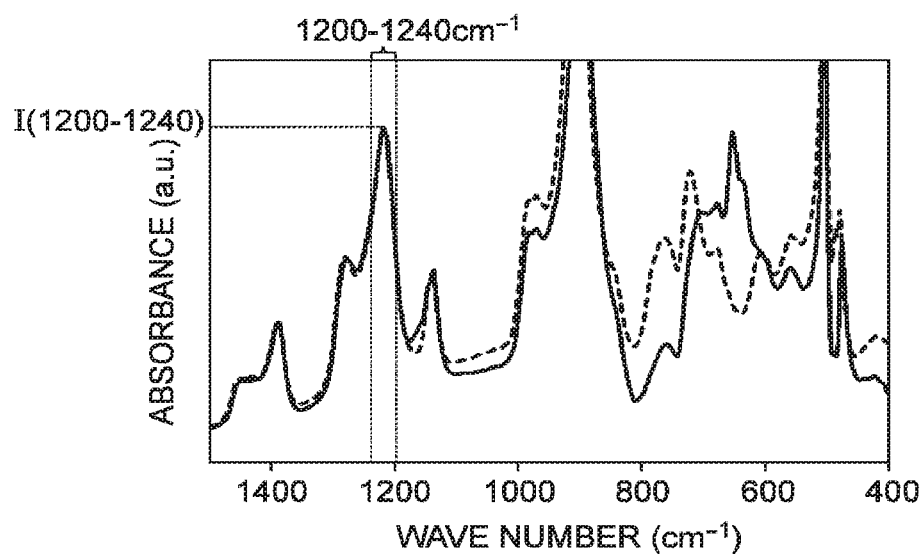
FIG. 4 shows the infrared spectrum of the phosphor.

FIG. 4 shows the enlarged drawing of the range of 400 to 1,500 $cm^{-1}$ of the infrared spectrum of FIG. 3. FIG. 4 also shows the measurement data of a $K_2SiF_6$ powder that is not activated with Mn (for example, a commercially available reagent manufactured by Kanto Kagaku) by a dotted line.

From FIG. 4, the phosphor activated with Mn and the $K_2SiF_6$ powder not activated with Mn show approximately similar spectra in the range of 800 to 1,500 $cm^{-1}$. It is considered that the spectrum of the phosphor activated with Mn in the range of 800 to 1,500 $cm^{-1}$ corresponds to the oscillation mode inherent in $K_2SiF_6$, which is the base material. The inventors focused on the absorption peaks in the range of 1,200-1,240 $cm^{-1}$ among the absorption peaks inherent in $K_2SiF_6$. In FIG. 4, the range of 1,200-1,240 $cm^{-1}$ is surrounded by a dotted line. The intensity of the absorption peak, present in this range, is I (1,200-1,240). At this time, the intensity of I (1,200-1,240) is 1.66.

Figure 5:
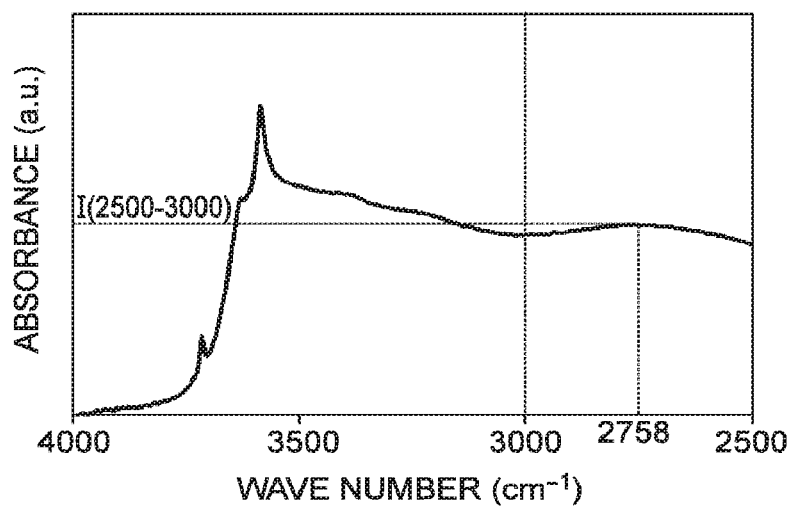
FIG. 5 shows the infrared spectrum of the phosphor.

FIG. 5 shows an enlarged drawing of the infrared spectrum of FIG. 3 in the range of 2,500 to 4,000 $cm^{-1}$.

From FIG. 5, sharp absorption peaks can be confirmed around 3,720, 3,630 and 3,590 $cm^{-1}$. Furthermore, a broad absorption band can be confirmed in the region of 2,500 to 3,000 $cm^{-1}$. The former absorption peaks are considered to be inherent in the hydroxide ion ($OH^-$) present in the phosphor. Furthermore, the latter broad absorption band is considered to be attributed to the OH stretching vibration contained in the water molecules that is adsorbed by the phosphor itself or hydrogen-bonded or coordinate bonded to the crystal. In the broad absorption peak at 2,500 to 3,000 cm$^{-1}$ in FIG. 5, among the absorption peaks present in this range, the absorbance of the absorption peak having the maximum absorbance is I (2,500-3,000). The wave number at the maximum absorbance is 2,758 cm$^{-1}$. The absorbance of the absorption peak at a wave number of 2,758 cm$^{-1}$ is I (2,500-3,000). At this time, the value of the absorbance I (2,500-3,000) is 0.0442. At this time, the value of I (2,500-3,000)/I (1,200-1,240) is 0.027, and thus satisfies the relationship of I (2,500-3,000)/I (1,200-1,240)<0.04.

Figure 6:
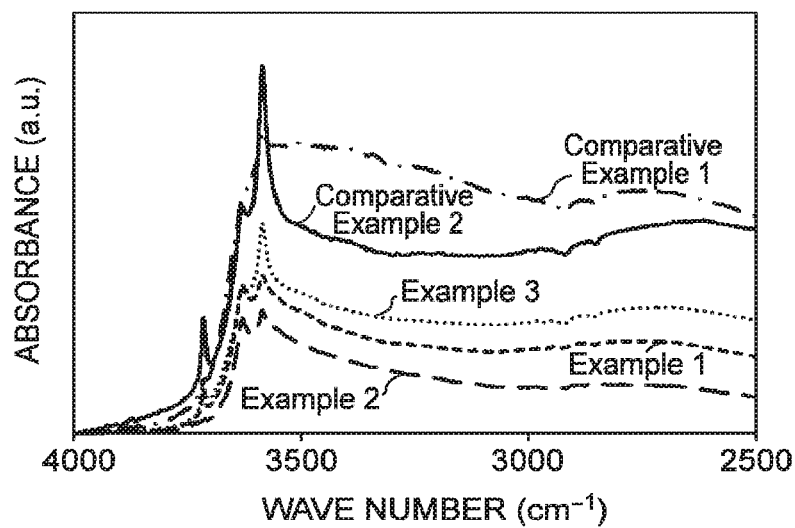
FIG. 6 shows infrared spectra of Examples and Comparative Examples.
Figure 7:
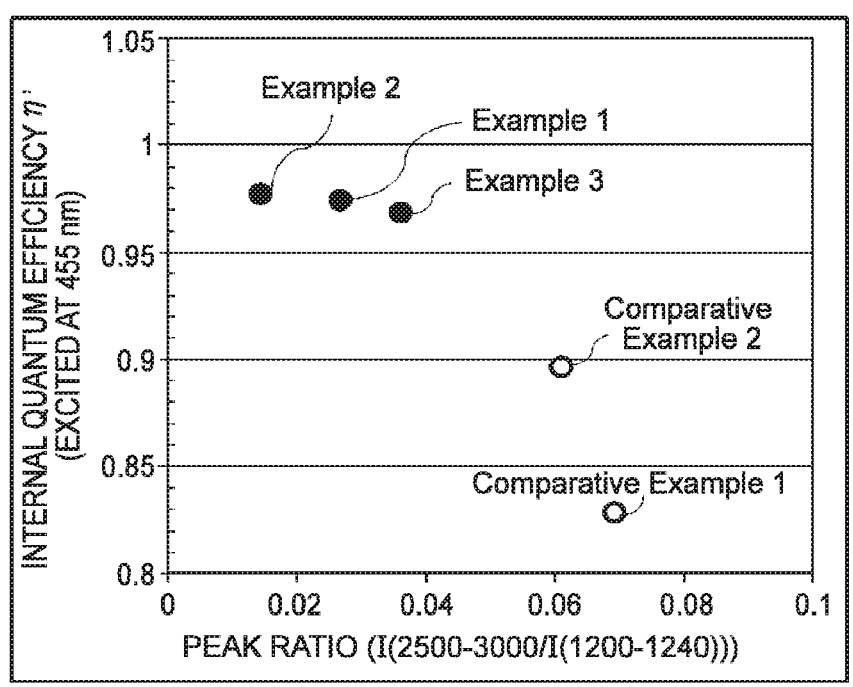
FIG. 7 shows the relationship between the internal quantum efficiency and the intensity ratio of specific peaks in the infrared spectrum of Examples and Comparative Examples.

The result of the XRD measurement of the K$_2$SiF$_6$:Mn phosphor powder of the embodiment was identified by the powder X-ray diffraction intensity database. Since diffraction peaks having strong intensities near 2θ=18.88°, 31.07°, 38.30° and 44.52° attributed to the respective plane directions of (111), (220), (222) and (400) of K$_2$SiF$_6$ crystal structure were able to be seen, it was confirmed that the K$_2$SiF$_6$:Mn phosphor powder of the embodiment has a K$_2$SiF$_6$ crystal structure. When the internal quantum efficiency η' of the K$_2$SiF$_6$:Mn phosphor powder was measured, it was confirmed that the internal quantum efficiency η' was 98°.

filter used in the filtration process was 1 μm diameter. Furthermore, the phosphor was evaluated by similar evaluation methods to those in Example 1, and the evaluation results were as shown in Table 2. The value of I (2,500-3,000)/I (1,200-1,240) was 0.069. The internal quantum efficiency η' was 83%. The infrared spectrum of the phosphor is shown in FIG. 6. The relationship between the quantum efficiency and the value of I (2,500-3,000)/I (1,200-1,240) in the phosphor is shown in FIG. 7.

COMPARATIVE EXAMPLE 2

The phosphor was prepared in a similar preparation method to that of Example 1 under the preparation conditions shown in Table 1. Furthermore, the phosphor was evaluated by similar evaluation methods to those in Example 1, and the evaluation results are as shown in Table 2. The infrared spectrum of the phosphor is shown in FIG. 6. The relationship between the quantum efficiency and the value of I (2,500-3,000)/I (1,200-1,240) in the phosphor is shown in FIG. 7.

TABLE 1

| Parameters | Example 1 | Example 2 | Example 3 | Comparative Example 1 | Comparative Example 2 |
|---|---|---|---|---|---|
| KF/HF (g/ml) | 12/40 | 6/40 | 24/40 | 12/40 | 12/40 |
| Opening diameter of filter (μm) | 10 | 10 | 10 | 1 | 1 |

TABLE 2

| Evaluation results | Example 1 | Example 2 | Example 3 | Comparative Example 1 | Comparative Example 2 |
|---|---|---|---|---|---|
| I(2500-3000)/I(1200-1240) | 0.027 | 0.014 | 0.036 | 0.069 | 0.061 |
| Internal quantum efficiency η' (excited at 455 nm) | 0.98 | 0.98 | 0.97 | 0.83 | 0.90 |

The conditions for the preparation of the phosphor of the above-mentioned Embodiment 1 are shown in Table 1, and the evaluation results are shown in Table 2. The infrared spectrum of the phosphor is shown in FIG. 6. The relationship between the quantum efficiency and I (2,500-3,000)/I (1,200-1,240) of the phosphor is shown in FIG. 7.

EXAMPLES 2 AND 3

Phosphors were prepared in a similar preparation method to that of Example 1, except that the KF/HF ratio shown in Table 1 was changed. Furthermore, the phosphors were evaluated by similar evaluation methods to those in Example 1, and the evaluation results are as shown in Table 2. The infrared spectra of the phosphors are shown in FIG. 6. The relationship between the quantum efficiency and the value of I (2,500-3,000)/I (1,200-1,240) is shown in FIG. 7.

COMPARATIVE EXAMPLE 1

The phosphor was prepared in a similar preparation method to that of Example 1, except that the opening size of the filter shown in Table 1 was changed. However, the H$_2$SiF$_6$ solution was prepared by dissolving an SiO$_2$ powder in an aqueous HF solution in the above-mentioned Examples 1 to 3, whereas a commercially available H$_2$SiF$_6$ solution with a concentration of 40% (Showa Chemical MSDS) was used in Comparative Example 1. The opening size of the According to the embodiments, phosphors having excellent quantum efficiency can be synthesized and light-emitting devices using these phosphors can be provided without decreasing the reliability.

Although several embodiments of the present invention have been described, these embodiments are presented as examples and are not intended to limit the scope of the invention. These embodiments can be conducted in other various embodiments, and various omissions, substitutions and changes can be made without deviating from the gist of the invention. These embodiments and variations thereof are included in the scope and gist of the inventions and are also included in the inventions described in the scopes of the claims and any equivalents thereof.

What is claimed is:

1. A phosphor comprising:
    a chemical composition expressed by the following formula

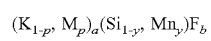
    $(K_{1-p}, M_p)_a(Si_{1-y}, Mn_y)F_b$ where M is at least one element selected from the group consisting of Na and Ca, and p satisfies 0≤p≤0.01, a satisfies 1.5≤a≤2.5, b satisfies 5.5≤b≤6.5, and y satisfies 0<y≤0.1,
    wherein the phosphor has absorption peak in a range of 2,500-3,000 cm$^{-1}$ and
    satisfies I (2,500-3,000)/I (1,200-1,240)<0.04, where I (1,200-1,240) is an intensity of a highest peak in a range of 1,200-1,240 $cm^{-1}$ and I (2,500-3,000) is an intensity of a highest peak in a range of 2,500-3,000 $cm^{-1}$ in an infrared spectrum.

2. The phosphor according to claim 1, wherein the phosphor has an internal quantum efficiency η' of 95% or more.

3. The phosphor according to claim 1, wherein the phosphor is activated with $Mn^{4+}$.

4. The phosphor according to claim 1, wherein the highest peak present in the range of 1,200-1,240 $cm^{-1}$ is a peak inherent in $K_2SiF_6$.

5. The phosphor according to claim 1, which is a red phosphor.

6. A light-emitting device, comprising:
a light-emitting element that emits light at the wavelength region of 430 nm or more and 470 nm or less, and
a phosphor layer comprising the phosphor according to claim 1.

7. The light-emitting device according to claim 6, wherein the phosphor layer further comprises a yellow light-emitting phosphor.

8. The light-emitting device according to claim 6, wherein the phosphor layer further comprises a green light-emitting phosphor.

9. The phosphor according to claim 1, wherein the phosphor satisfies:

$I$ (2,500-3,000)/I (1,200-1,240)≤0.027.

* * * * *